United States Patent
Boettcher et al.

(10) Patent No.: US 6,383,929 B1
(45) Date of Patent: May 7, 2002

(54) COPPER VIAS IN LOW-K TECHNOLOGY

(75) Inventors: Steven H. Boettcher, Fishkill; Herbert L. Ho, Cornwall; Mark Hoinkis, Fishkill; Hyun Koo Lee, LaGrangeville; Yun-Yu Wang, Poughquag; Kwong Hon Wong, Wappingers Falls, all of NY (US)

(73) Assignees: International Business Machines Corporation, Armonk; Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/759,015

(22) Filed: Jan. 11, 2001

(51) Int. Cl.[7] .................... H01L 21/44; H01L 21/4763
(52) U.S. Cl. .................. 438/687; 438/643; 438/644; 438/653; 438/654
(58) Field of Search ................ 438/687, 643, 438/644, 653, 654, 652, 642

(56) References Cited

U.S. PATENT DOCUMENTS 6,080,669 A * 6/2000 Iacoponi et al. ............ 438/672
6,303,490 B1 * 10/2001 Jeng ............................ 438/627

OTHER PUBLICATIONS

US Pre–Grant Publication US 2001/0033025 A1.*

* cited by examiner

Primary Examiner—Charles Bowers
Assistant Examiner—Erik Kielin
(74) Attorney, Agent, or Firm—Eric W. Petraske

(57) ABSTRACT

In integrated circuits having copper interconnect and low-k interlayer dielectrics, a problem of open circuits after heat treatment was discovered and solved by the use of a first liner layer of Ti, followed by a conformal liner layer of CVD TiN, followed in turn by a final liner layer of Ta or TaN, thus improving adhesion between the via and the underlying copper layer while reducing the increase in resistance caused by alloying between the Ti and the Copper to an acceptable amount.

5 Claims, 2 Drawing Sheets

COPPER VIAS IN LOW-K TECHNOLOGY

FIELD OF THE INVENTION

The field of the invention is that of forming integrated circuits with copper metallization and low-k dielectrics,

BACKGROUND OF THE INVENTION

In the field of copper with oxide, the art has developed a set of compatible materials to line the trenches and vias that contain the copper. The lining must adhere to the dielectric and block diffusion.

Conventionally, in oxide dielectric circuits, a dual damascene structure combining a via connected to a lower level with a horizontal interconnection member includes an adhesion layer of Ta or TaN, a barrier layer of TaN to prevent diffusion of the copper and a top layer of Ta or TaN prior to Cu seed deposition.

As the dimension of semiconductor devices continues to shrink, the RC delay of its metal interconnects becomes a major limiting factor of the device speed. In order to resolve this issue, implementation of copper interconnects (which reduces resistance, R) in a low-k dielectric material (which reduces capacitance, C, between the metal lines) becomes a key issue for the semiconductor industry to shrink the device deep sub-micrometer dimension.

The most economical way to implement Cu low-k metallization process is to use a dual-damascene structure with metal via and metal lines being etched and filled with Cu metal in one process step. The excess Cu is removed by CMP (chemical mechanical polishing). In a dual-damascene structure, a barrier layer (or multiple layers) between the Cu metal and the dielectric material is required for both metal vias and metal lines. This barrier layer is known as a liner. The liner has two functions: as a Cu diffusion barrier to prevent Cu from diffusing into the dielectric material and as a contact layer between Cu metal via and underlying metal line (which can be made of Cu or W).

In the field of Cu dual-damascene metallization structures in $SiO_2$ dielectric (which is not considered as low-k dielectric material), the prior art has developed a set of compatible materials for the liner, such as Ta, TaN, and CVD TiN. It has been discovered that Ta has good adhesion with Cu metal and CVD TiN has better coverage on the sidewall of the line and via, especially for high aspect ratio structures.

However, in the field of forming Cu metal interconnects in low-k dielectric material, new problems have arisen that do not have a counterpart in the Cu metal interconnects in $SiO_2$ dielectric. For instance, one of the low-k dielectric such as SiLK has several material properties that do not exist in $SiO_2$. SiLK is polymer material, and is largely made of C. SiLK is also a soft material with a very high thermal expansion coefficient. Because of these unique properties of SiLK material, the requirements for Cu metal interconnects in that material, such as coverage of the sidewall of via and adhesion between liner and underlying metal (Cu or W metal), is different from corresponding requirements in Cu metallization in $SiO_2$ dielectric material.

In addition, the fact that the dimensions of vias and metal lines are decreasing, with a corresponding increase in the aspect ratio of vias, adds additional requirements on the liner for a dual-damascene structure.

SUMMARY OF THE INVENTION

The invention relates to a combination of materials and structure for copper interconnect circuits using low-k dielectrics that provides the required adhesion between the bottom of a via and the lower copper interconnection member, together with adequately low resistance.

A feature of the invention is that the adhesion between the bottom of a via and the underlying interconnect is sufficient to withstand the stress caused by thermal cycling.

Another feature of the invention is that carbon contamination on the bottom of a via is reduced by the gettering action of a layer of Ti.

Yet another feature of the invention is the formation of a high-strength, relatively high resistance Ti-Cu alloy only in the small region at the base of the via, thereby limiting the amount of resistance in the interconnect.

DESCRIPTION OF THE PREFERRED EMBODIMENT

In testing integrated circuits combining copper metallization with low-k dielectric (e.g. SILK from Dow) an unexpected problem was identified.

In contrast to the prior art work in copper interconnects with oxide interlayer dielectric, an unacceptably high failure rate of open vias after thermal cycling occurred.

The cause of the problem was identified as mechanical separation between the bottom of the vias and the underlying copper members.

This problem can only increase as the transverse dimensions of vias shrink (and their aspect ratio increases).

Figure 2:
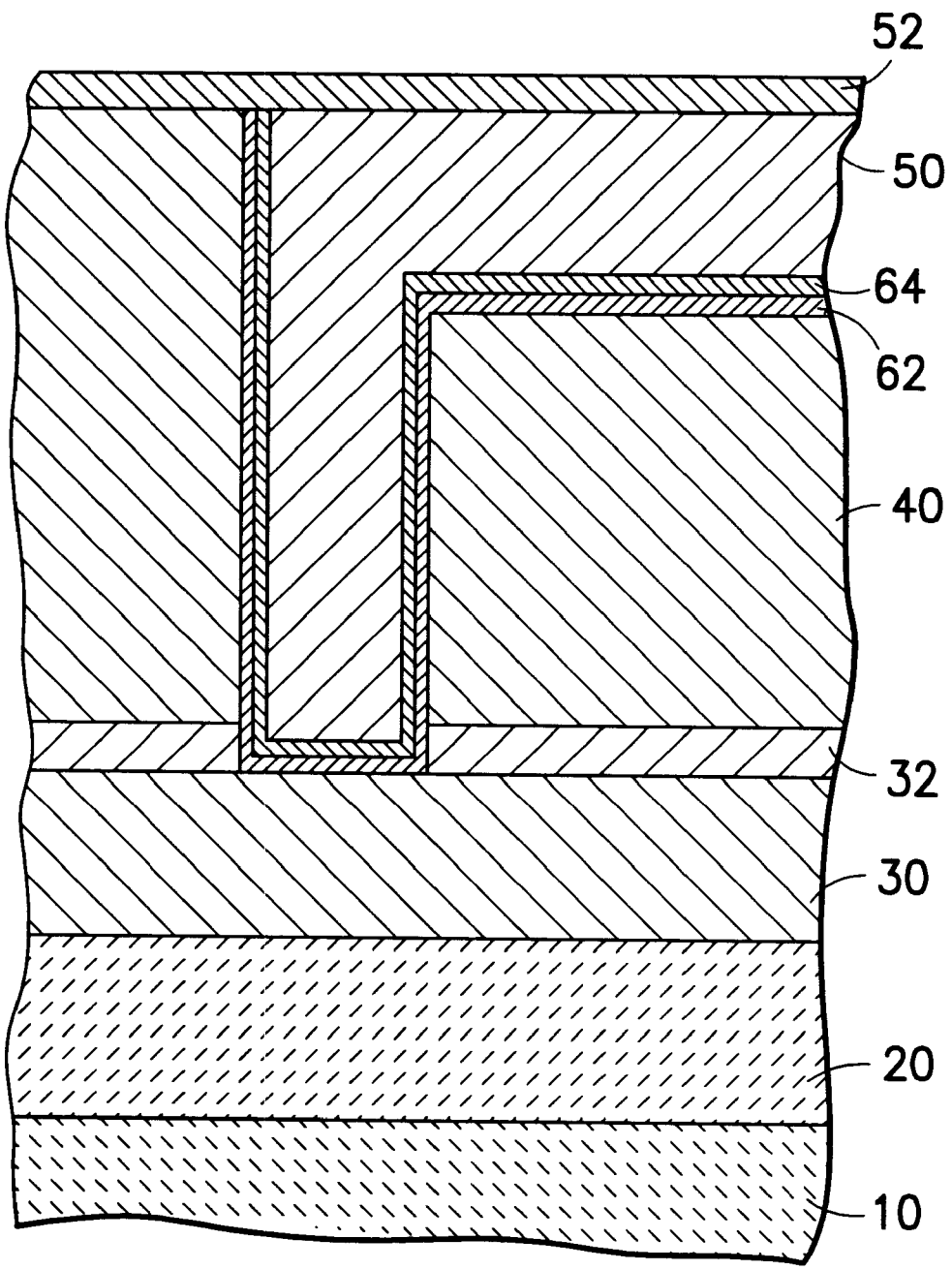
FIG. 2 shows a portion of interconnect according to the prior art.

Referring now to FIG. 2, there is shown a typical via according to the prior art. Lower dielectric layer 20 is disposed on a silicon substrate 10. A first copper layer 30 extends from left to right. A conventional barrier layer 32, referred to as a capping layer, e.g. SiN, has been deposited on copper layer 30.

In the center of the Figure, a via extends down from copper layer 50 to make contact with layer 30. The copper is lined with a conventional combination of a CVD TiN liner 62 and a Ta liner 64. In an illustrative embodiment, for a process having a nominal ground rule of 200 nm, the thickness of layer 40 is nominally 620 nm, the dimensions of the via are nominally 200 nm by 200 nm and the aspect ratio is nominally 3. As dimensions shrink, the aspect ratio (and thus the strain on the bond at the bottom of the via) will increase.

It has been found that this combination, while satisfactory before any heat stress, results in an unacceptably high failure rate after 100 minutes at 300° C. A normal thermal range is −60° C. to +200° C. The cause of this failure rate has been identified as mechanical separation at the bottom of the via. The thermal expansion coefficient of SiLK is five times greater than that of copper, so that the interlayer dielectric exerts great stress on the joint at the bottom of the via when the circuit temperature rises.

At least one cause of this separation is that carbon is emitted (outgassed) from the low-k dielectric during the previous steps of etching the via. This carbon is not entirely removed by conventional cleaning processes such as sputter cleaning and interferes with the formation of a good bond between the top surface of the copper and the bottom surface of the liner. In addition, oxygen can be adsorbed on the exposed bottom of the via when the wafer is exposed to air. The combination of these effects weakens an already low-strength bond between the TaN and the copper and gives rise to the phenomenon of creating open circuits under thermal stress. This has created a difficult problem in combining the beneficial features of copper interconnect and low-k dielectric.

Figure 1:
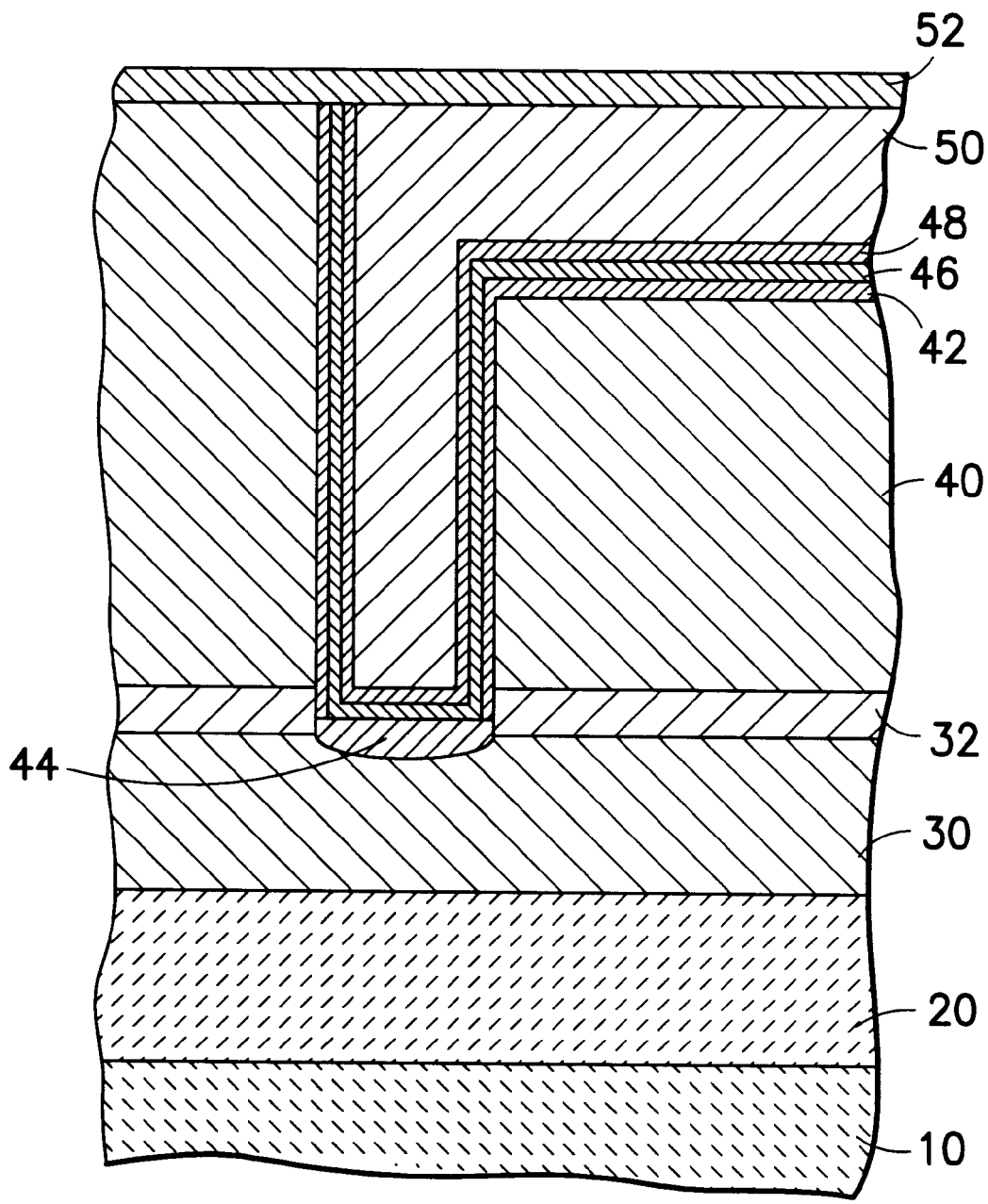
FIG. 1 shows a portion of interconnect according to the invention.

Referring now to FIG. 1, there is shown an embodiment of the invention, in which the liners 62 and 64 have been replaced with a first liner 42 of sputtered Ti, nominally 10 nm–20 nm thick at the bottom of the via. Coverage of Ti on the sides will be less than at the bottom, as sputtered Ti does not cover vertical surfaces well. As will be explained below, this difference in coverage is not a problem.

At the bottom of the via, a portion of the lower Cu layer, denoted with the numeral 44, represents a Cu-Ti alloy that has a significantly higher resistivity than Cu. One skilled in the art would therefore not think to use Ti as the bottom liner layer because it increases the total resistance of the via chain. As will be discussed below, this disadvantage is overcome by other benefits.

Next, a CVD TiN (deposited by chemical vapor deposition) liner 46, nominally 5 nm–10 nm thick, has been deposited in standard conditions. This layer is conformal and compensates for the lack of coverage of the first layer. Advantageously, the CVD TiN adheres well to the SiLK, so that the lesser coverage on the walls of the via of the Ti first layer is not a problem.

TiN liner 46 also covers the Ti first layer on the horizontal surfaces of the upper interconnect. This has the advantage of preventing the horizontal portion of Ti layer 42 from reacting with the copper to form an alloy having a relatively high resistance. The only location where the Ti can react with the Cu is at the bottom of the via in the region denoted with the numeral 44. The high-resistance alloy is thus confined to a small area and does not significantly affect the overall resistance of the interconnect.

The final layer of the liner is a Ta layer 48, nominally 25 nm thick, that serves to improve the bonding between the TiN liner and the Cu interconnect member. TaN may also be used.

Experimental results have shown that vias constructed according to the invention have reduced the failure rate dramatically. Moreover, a thicker layer (10 nm instead of 5 nm) of Ti produces a lower total resistance through the via chain than a thinner layer, even though the resistance of the thicker Ti-Cu alloy will be greater. It is thought that this counter-intuitive result is caused by a reduced number of voids at the via bottom when a thicker layer of Ti is used.

In operation, the first layer of copper interconnect is deposited and patterned as usual. The first layer of dielectric is also deposited as usual. Next, a set of vias is etched through the interlayer dielectric, preferably in a dual-damascene process. A set of three liner layers is put down and, if preferred, removed outside the channels for the second layer of copper by conventional CMP.

The second layer of copper is put down and patterned. The process is repeated as often as required until all the layers of copper are put down.

An alternative method is the addition to the initially pure Ti of a mixture of nitrogen gas added at the end, so that the resulting layer is Ti(N) with a gradient of N increasing toward the top of the layer, therefore providing better adhesion to the CVD TiN layer.

While the invention has been described in terms of a single preferred embodiment, those skilled in the art will recognize that the invention can be practiced in various versions within the spirit and scope of the following claims.

We claim:

1. A method of forming copper interconnections in an integrated circuit comprising the steps of:

(a) depositing and patterning a first layer of copper interconnect;

(b) depositing a first layer of low dielectric constant interlayer dielectric;

(c) forming a set of vias through said first layer of low dielectric constant interlayer dielectric, stopping on said first layer of copper interconnect;

(d) depositing a first liner layer of Ti within said set of vias;

(e) depositing a second liner layer of CVD TiN in said set of vias;

(f) depositing a third liner layer selected from the group consisting of Ta and TaN in said set of vias; and (g) depositing and patterning a second layer of copper interconnect.

2. A method according to claim 1, further including repeating said steps (b) through (g) to form a set of interconnection layers above said second layer of copper interconnect.

3. A method according to claim 1, in which said low dielectric constant interlayer dielectric comprises SiLK.

4. A method according to claim 2, in which said low dielectric constant interlayer dielectric comprises SiLK.

5. A method according to claim 1, further comprising the step of adding N vapor to said Ti in said step (d) above, whereby said first liner layer is formed from Ti(N), whereby adhesion to said TiN layer is improved.

\* \* \* \* \*